United States Patent
Chae et al.

(10) Patent No.: US 7,916,061 B2
(45) Date of Patent: Mar. 29, 2011

(54) APPARATUS AND METHOD FOR SIGMA-DELTA ANALOG TO DIGITAL CONVERSION

(75) Inventors: Youngcheol Chae, Seoul (KR); In Hee Lee, Seoul (KR); Jimin Cheon, Yongin-si (KR); Gunhee Han, Seoul (KR); Seog Heon Ham, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 14 days.

(21) Appl. No.: 12/427,303

(22) Filed: Apr. 21, 2009

(65) Prior Publication Data
US 2009/0261998 A1    Oct. 22, 2009

(30) Foreign Application Priority Data

Apr. 21, 2008    (KR) .................. 10-2008-0036555

(51) Int. Cl.
*H03M 1/12*    (2006.01)
(52) U.S. Cl. ........ 341/155; 341/118; 341/143; 341/166; 341/167; 341/168
(58) Field of Classification Search .............. 341/76–77, 341/143, 156, 158
See application file for complete search history.

(56) References Cited

U.S. PATENT DOCUMENTS

| | | | | |
|---|---|---|---|---|
| 5,844,514 A | * | 12/1998 | Ringh et al. | 341/143 |
| 5,886,659 A | * | 3/1999 | Pain et al. | 341/155 |
| 5,936,562 A | * | 8/1999 | Brooks et al. | 341/143 |
| 6,243,034 B1 | * | 6/2001 | Regier | 341/166 |
| 6,920,182 B2 | * | 7/2005 | Bolton, Jr. | 375/247 |
| 6,970,118 B2 | * | 11/2005 | Regier | 341/118 |
| 7,504,977 B2 | * | 3/2009 | Doorenbos et al. | 341/143 |

* cited by examiner

*Primary Examiner* — Khai M Nguyen
(74) *Attorney, Agent, or Firm* — F. Chau & Associates, LLC

(57) ABSTRACT

A method and apparatus are provided for sigma-delta (ΣΔ) analog to digital conversion, the method including receiving an analog signal, sampling the received signal, comparing the sampled signal with a constant reference voltage, providing at least one high-order bit responsive to the constant reference comparison, comparing the sampled signal with a variable reference voltage, providing at least one low-order bit responsive to the variable reference comparison, and combining the at least one high-order bit with the at least one low-order bit; and the apparatus including a comparator, a first ADC portion supplying the comparator with a constant reference voltage for providing at least one high-order bit, and a second ADC portion supplying the comparator with a variable reference voltage for providing at least one low-order bit.

38 Claims, 17 Drawing Sheets

US 7,916,061 B2

APPARATUS AND METHOD FOR SIGMA-DELTA ANALOG TO DIGITAL CONVERSION

CROSS-REFERENCE TO RELATED APPLICATION

This application claims foreign priority under 35 U.S.C. §119 to Korean Patent Application No. 10-2008-0036555, filed on Apr. 21, 2008, in the Korean Intellectual Property Office, the disclosure of which is incorporated by reference herein in its entirety.

BACKGROUND OF THE INVENTION

The present disclosure generally relates to analog to digital conversion. More particularly, the present disclosure relates to sigma-delta (ΣΔ) analog to digital conversion.

SUMMARY OF THE INVENTION

These and other issues are addressed by an apparatus and method for sigma-delta (ΣΔ) analog to digital conversion. Exemplary embodiments are provided.

An exemplary embodiment provides an analog-to-digital converter (ADC) comprising: a first ADC unit having a comparator with a constant reference voltage for providing at least one high-order bit; and a second ADC unit connected to the first ADC unit, the second ADC unit having a comparator with a variable reference voltage for providing at least one low-order bit.

Another exemplary embodiment provides an n analog-to-digital converter (ADC) comprising: a comparator; a first ADC portion supplying the comparator with a constant reference voltage for providing at least one high-order bit; and a second ADC portion supplying the comparator with a variable reference voltage for providing at least one low-order bit.

An exemplary embodiment provides a CMOS image sensor comprising: a pixel driver; and an analog-to-digital converter (ADC) connected to the driver, the ADC having a comparator, a first ADC portion supplying the comparator with a constant reference voltage for providing at least one high-order bit, and a second ADC portion supplying the comparator with a variable reference voltage for providing at least one low-order bit.

An exemplary embodiment provides an analog-to-digital converting method comprising: receiving an analog signal; sampling the received signal; comparing the sampled signal with a constant reference voltage; providing at least one high-order bit responsive to the constant reference comparison; comparing the sampled signal with a variable reference voltage; providing at least one low-order bit responsive to the variable reference comparison; and combining the at least one high-order bit with the at least one low-order bit.

An exemplary embodiment provides an image sensing method comprising: sensing an analog voltage signal of a sensor pixel; sampling the sensed signal; comparing the sampled signal with a constant reference voltage; providing at least one high-order bit responsive to the constant reference comparison; comparing the sampled signal with a variable reference voltage; providing at least one low-order bit responsive to the variable reference comparison; and combining the at least one high-order bit with the at least one low-order bit.

Another exemplary embodiment provides an analog-to-digital converter (ADC) device comprising: a sigma-delta ADC for sampling an analog input signal at a first sampling rate and providing at least one upper bit of a digital output signal and an error signal; and a single-slope ADC connected to the sigma-delta ADC for receiving the error signal and providing at least one lower bit of the digital output signal.

An exemplary embodiment provides an analog-o-digital converting method comprising: sampling an analog input signal at a first sampling rate and providing at least one upper bit of a digital output signal and an error signal; and providing at least one lower bit of the digital output signal responsive to the error signal.

An exemplary embodiment provides a multi-media system comprising: at least one input/output device; and a multi-media processor connected to the at least one input/output device, the multi-media processor having a sigma-delta analog-to-digital converter (ADC) for sampling an analog input signal at a first sampling rate and providing at least one upper bit of a digital output signal and an error signal, and a single-slope ADC connected to the sigma-delta ADC for receiving the error signal and providing at least one lower bit of the digital output signal.

Another exemplary embodiment provides a CMOS image sensor comprising: a pixel array; a driver connected to the pixel array; and an analog-to-digital converter (ADC) unit connected to the driver, the ADC unit having a sigma-delta ADC for sampling an analog input signal at a first sampling rate and providing at least one upper bit of a digital output signal and an error signal, and a single-slope ADC connected to the sigma-delta ADC for receiving the error signal and providing at least one lower bit of the digital output signal.

The present disclosure will be further understood from the following description of exemplary embodiments, which is to be read in connection with the accompanying drawings.

BRIEF DESCRIPTION OF THE DRAWINGS

The present disclosure provides an apparatus and method for sigma-delta (ΣΔ) analog to digital conversion in accordance with the following exemplary figures, in which like reference numerals may be used to indicate like elements in the several figures, where.

DETAILED DESCRIPTION OF PREFERRED EMBODIMENTS

The present disclosure provides an apparatus and method for sigma-delta (ΣΔ) analog to digital conversion. Exemplary embodiments receive an analog signal at a first analog to digital converter (ADC) with a fixed reference voltage, which provides high order bits to an adder and an error signal to a second ADC. The second ADC has a variable reference voltage, and provides low order bits to the adder. The adder, in turn, outputs a digital signal. The variable reference voltage is preferably a single-slope reference voltage. The first and second ADCs preferably share a single comparator.

Figure 1:
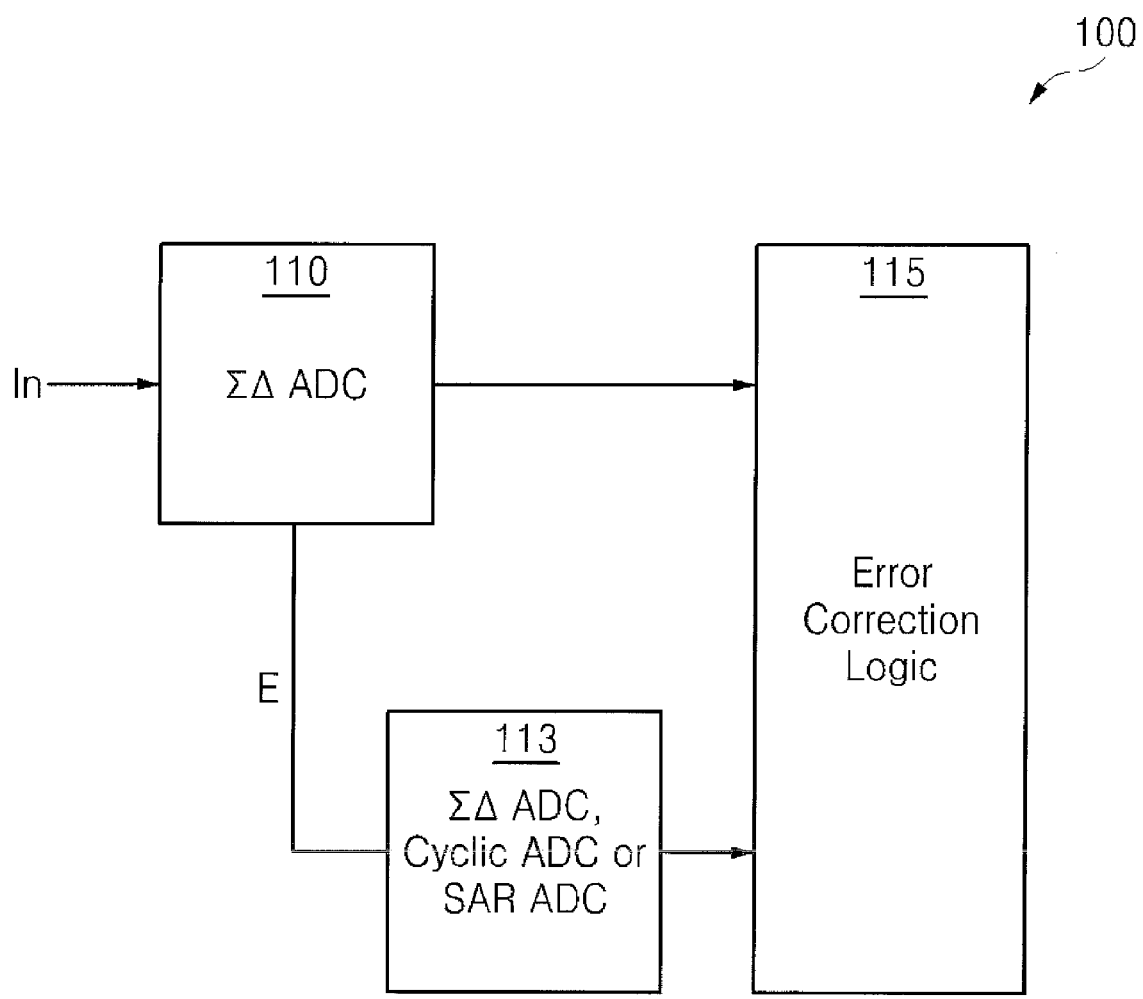
FIG. 1 shows a schematic block diagram of a sigma-delta (ΣΔ) analog to digital converter (ADC) system.

As shown in FIG. 1, a sigma-delta (ΣΔ) analog to digital converter (ADC) system is indicated generally by the reference numeral 100. The ΣΔ ADC system 100 includes a first ADC 110 for receiving an analog input signal, a second ADC 113 in signal communication with the first ADC, and error correction logic (ECL) 115 in signal communication with the first and second ADCs. Here, the first ADC 110 is a ΣΔ ADC. The second ADC 113 may be another ΣΔ ADC, a cyclic ADC or a successive approximation register (SAR) ADC. The first ADC 110 provides a remainder or error (E) signal to the second ADC 113.

Figure 2:
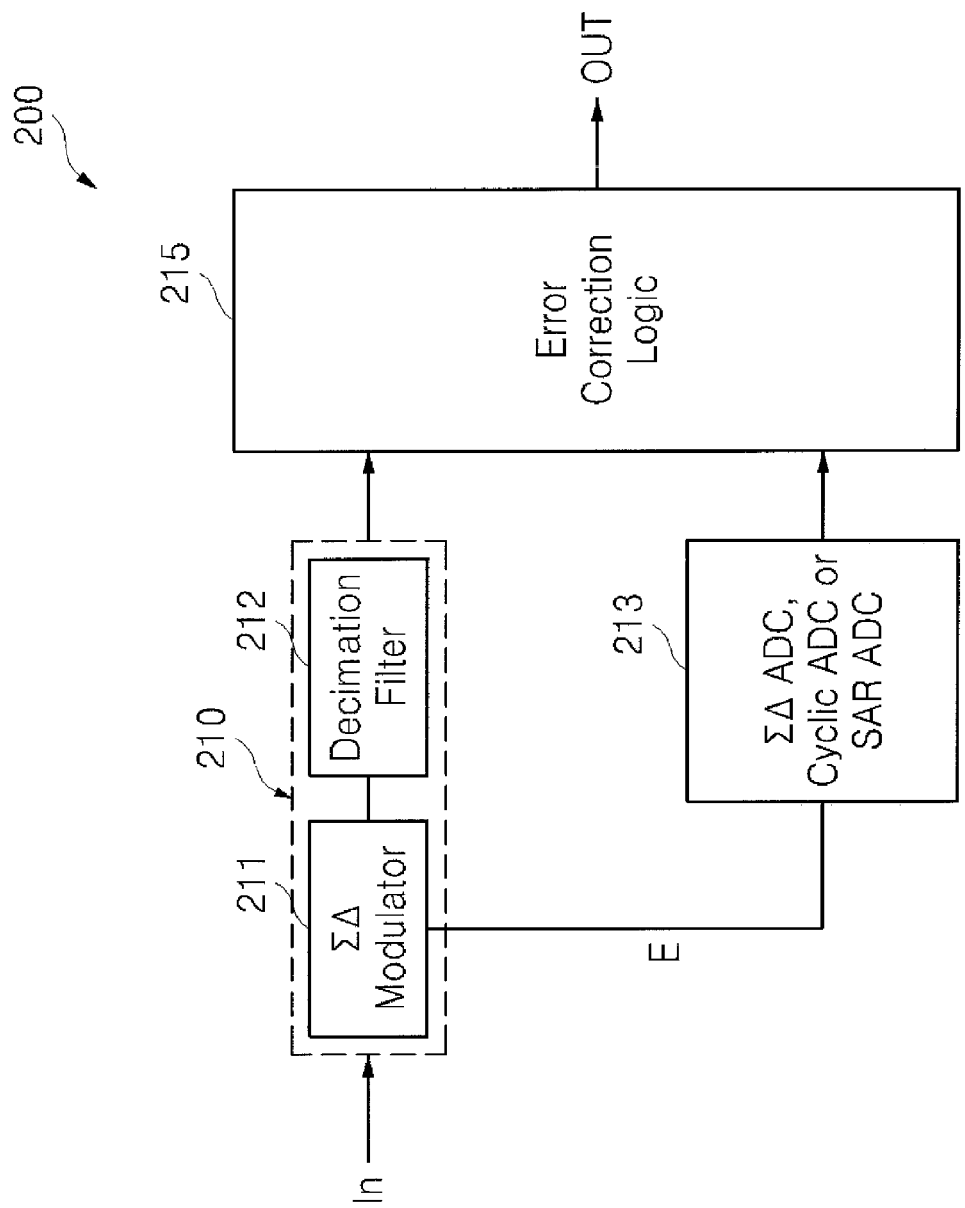
FIG. 2 shows schematic block diagram of another sigma-delta (ΣΔ) analog to digital converter (ADC) system.

Turning to FIG. 2, a similar sigma-delta (ΣΔ) analog to digital converter (ADC) system is indicated generally by the reference numeral 200. The ΣΔ ADC system 200 includes a first ADC 210 for receiving an analog input signal, a second ADC 213 in signal communication with the first ADC, and error correction logic (ECL) 215 in signal communication with the first and second ADCs. Here, the first ADC 210 includes a sigma-delta modulator 211 in signal communication with a decimation filter 212. The sigma-delta modulator 211 transmits the E signal to the second ADC 213. The ECL 215 outputs a converted digital signal. Unfortunately, the ECL 215 increases the complexity of the ΣΔ ADC 200, particularly when the ΣΔ ADC is fully embodied in hardware.

Figure 3:
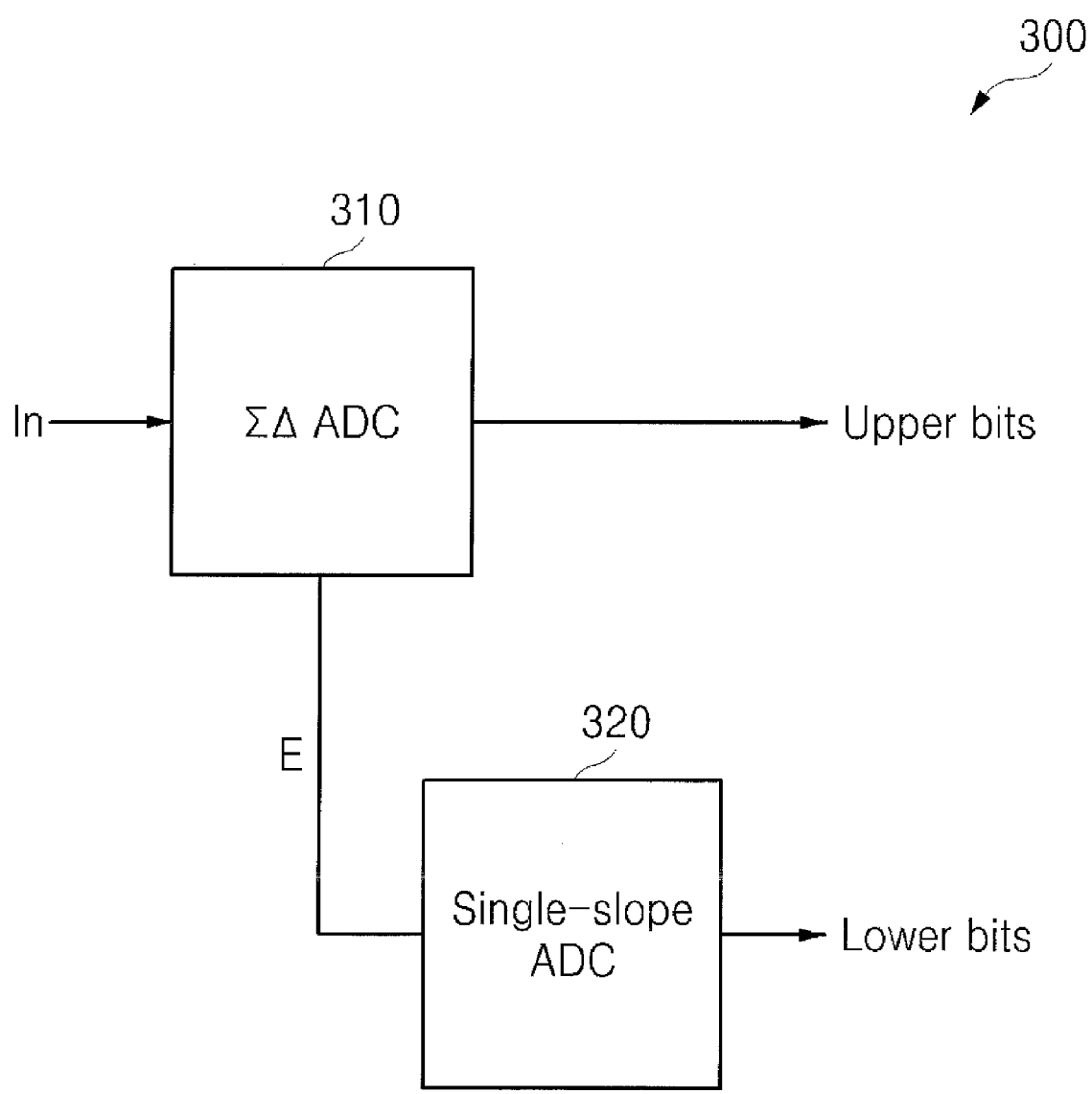
FIG. 3 shows a schematic block diagram of a sigma-delta (ΣΔ) analog to digital converter (ADC) system in accordance with a preferred embodiment of the present disclosure.

Turning now to FIG. 3, a different sigma-delta (ΣΔ) analog to digital converter (ADC) system is indicated generally by the reference numeral 300. The ΣΔ ADC system 300 includes a first ADC 310 for receiving an analog input signal, a second ADC 320 in signal communication with the first ADC. Here, the first ADC 310 is a ΣΔ ADC, and the second ADC 320 is a single-slope ADC. The ΣΔ ADC 310 outputs the upper bits of a converted digital signal, and the single-slope ADC 320 outputs the lower bits of the converted digital signal.

In comparison with the ADC systems 100 and 200 of FIGS. 1 and 2, respectively, the ADC system 300 does not need error correction logic (ECL). Thus, embodiments of the present disclosure can be configured substantially without ECL, particularly when the upper bits and the lower bits are DC signals, such as in CMOS image sensors, for example. That is, preferred embodiments do not need error correction logic for substantially constant or DC input signals, but may use logic for AC signals While the systems 100 and 200 convert the quantization error (E) signal of the ΣΔ modulator with a ΣΔ ADC, cyclic ADC or successive approximation register (SAR) ADC, the system 300 converts the E signal with a single-slope ADC.

Figure 4:
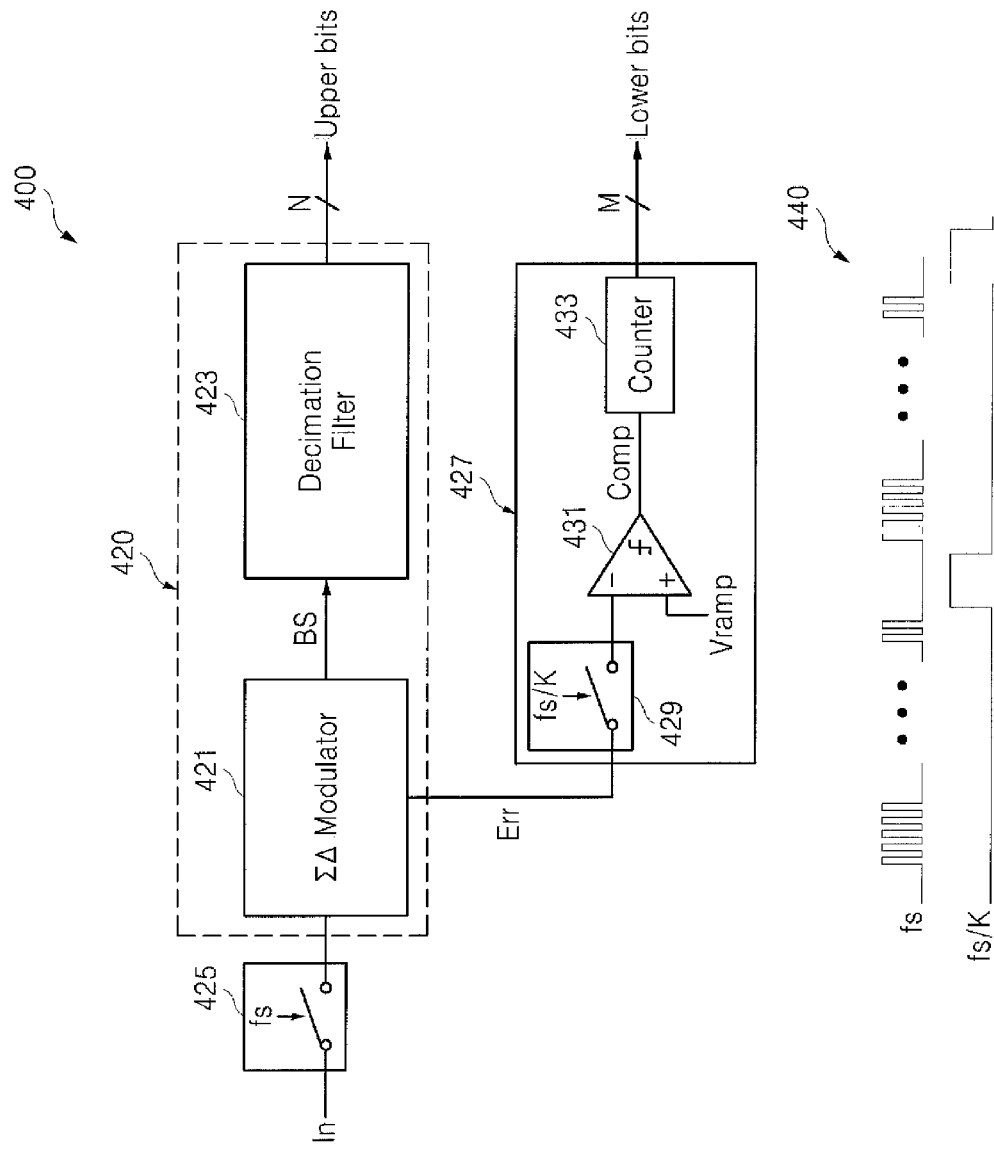
FIG. 4 shows a schematic hybrid diagram of another sigma-delta (ΣΔ) analog to digital converter (ADC) system in accordance with a preferred embodiment of the present disclosure.

As shown in FIG. 4, another sigma-delta (ΣΔ) analog to digital converter (ADC) system is indicated generally by the reference numeral 400. The ΣΔ ADC system 400 includes a first sampling switch 425 that samples at a first sampling frequency or rate fs for receiving and sampling an analog input signal, a first ADC 420 for receiving the fs sampled signal and providing N upper bits of digital output, and a second ADC 427 in signal communication with the first ADC for receiving an error (E) signal and providing M lower bits of digital output. Here, the first ADC 420 is a ΣΔ ADC including a ΣΔ modulator 421 in signal communication with a decimation filter 423. The modulator 421 provides a bit stream (BS) signal to the decimation filter 423, and provides an error (E) signal to the second ADC 427. The second ADC 427 is a single-slope ADC including a second sampling switch 429 that samples at a second sampling frequency or rate fs/K for receiving and sampling the E signal, a comparator 431 for comparing the sampled E signal with a voltage ramp signal, and a counter 433 for counting pulses from the comparator.

A signal graph 440 shows the sampling signals fs and fs/K. In operation of the system 400, the N upper bits are output when fs is high and Fs/k is low, and the lower M bits are output when fs is low and Fs/k is high. Thus, preferred embodiments separately output the upper bits and the lower bits, and may then add or combine the upper bits with the lower bits without the need for error correction logic. Preferably, the error of the sigma-delta modulator is converted to the lower bits by a single-slope ADC, where the input of the single-slope ADC comes from the sigma-delta modulator.

Figure 5:
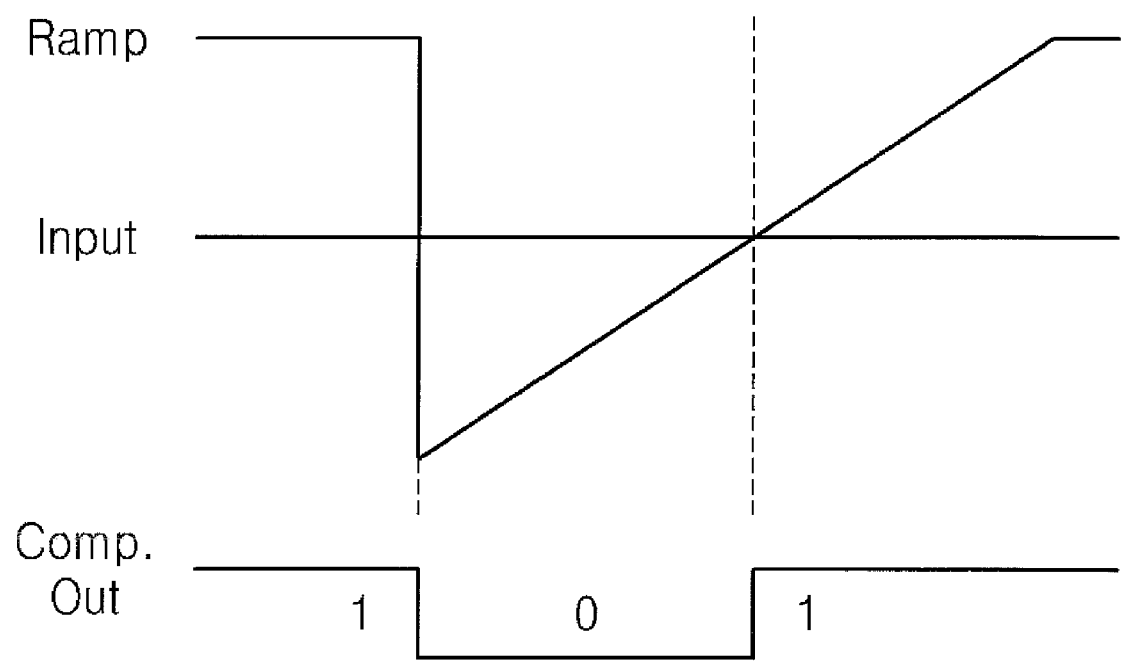
FIG. 5 shows a graphical diagram of input and output signals for the comparator of FIG. 4 in accordance with a preferred embodiment of the present disclosure.

Turning to FIG. 5, a plot of input and output signals are shown for the comparator 431 of FIG. 4. Here, the voltage ramp signal to the non-inverting input of the comparator and the input signal from the sampling switch 429 to the inverting input of the comparator result in a comparator output signal that is low when the ramp is less than the input.

Figure 6:
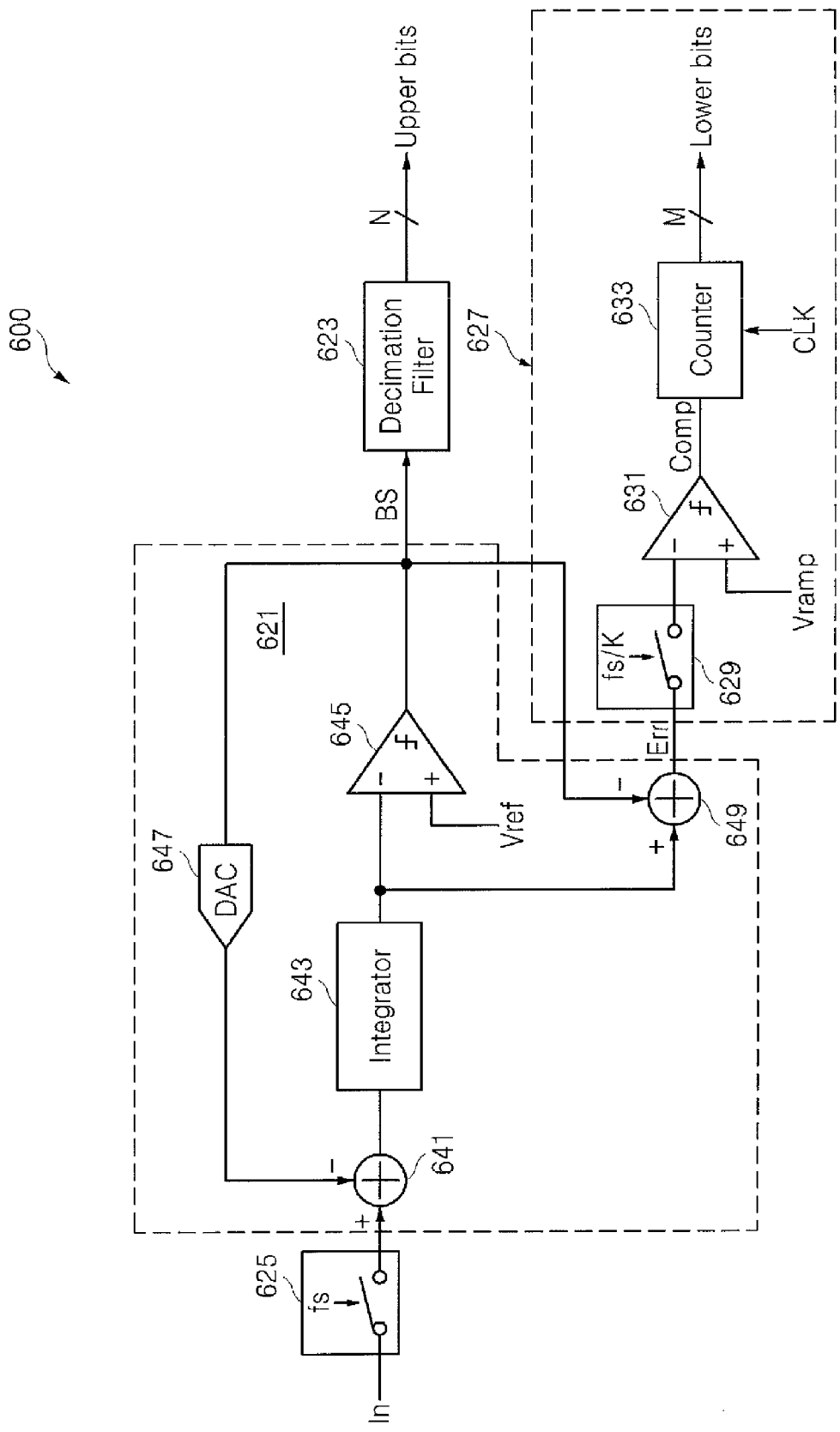
FIG. 6 shows a schematic block diagram of another sigma-delta (ΣΔ) analog to digital converter (ADC) system in accordance with a preferred embodiment of the present disclosure.

Turning now to FIG. 6, another sigma-delta (ΣΔ) analog to digital converter (ADC) system is indicated generally by the reference numeral 600. The ΣΔ ADC system 600 includes a first sampling switch 625 that samples at a rate fs for receiving and sampling an analog input signal, a ΣΔ modulator 621 in signal communication with the first switch 625 for receiving the fs sampled signal, a decimation filter 623 in signal communication with the modulator 621 for receiving a bit stream (BS) signal and providing N upper bits of digital output, and single-slope ADC 627 in signal communication with the modulator 621 for receiving an error (E) signal and providing M lower bits of digital output.

The modulator 621 includes a first summing junction 641 for receiving the fs sampled signal on a non-inverting input, an integrator 643 in signal communication with the first summing junction, a comparator 645 having an inverting input for receiving the output of the integrator and a non-inverting input for receiving a voltage reference, an optional digital to analog converter (DAC) 647 for receiving the digital output of the comparator and providing an analog input to an inverting input of the first summing junction 641, and a second summing junction 649 for receiving the output of the integrator 643 on a non-inverting input, receiving the output of the comparator 645 on an inverting input, and providing an error signal (E) to the single-slope ADC 627. The single-slope ADC 627 includes a second sampling switch 629 that samples at a rate fs/K for receiving and sampling the E signal, a comparator 631 for comparing the sampled E signal with a voltage ramp signal, and a counter 633 for counting pulses from the comparator and outputting the converted lower bits.

Here, the sigma-delta modulator includes an integrator and a first comparator with fixed reference voltage Vref, and may optionally include a DAC. The transfer function is defined by the z-transform:

$$Y = z^{-1}X + (1-z^{-1})E \quad \text{(Eqn. 1)}$$

In alternate embodiments, the error (E) point can be moved by adding a feed-forward and/or a feedback path, such as by performing another integration.

The single-slope ADC includes a second sampling switch or sampler, a second comparator with variable ramp voltage Vramp, and a counter. The variable ramp voltage Vramp may have steps or a staircase shape when plotted in the time domain. The slope or step size of Vramp determines the resolution of the lower bits. The error (E) between the input and the output of the first comparator is converted into the lower bits by the single-slope ADC.

Figure 7:
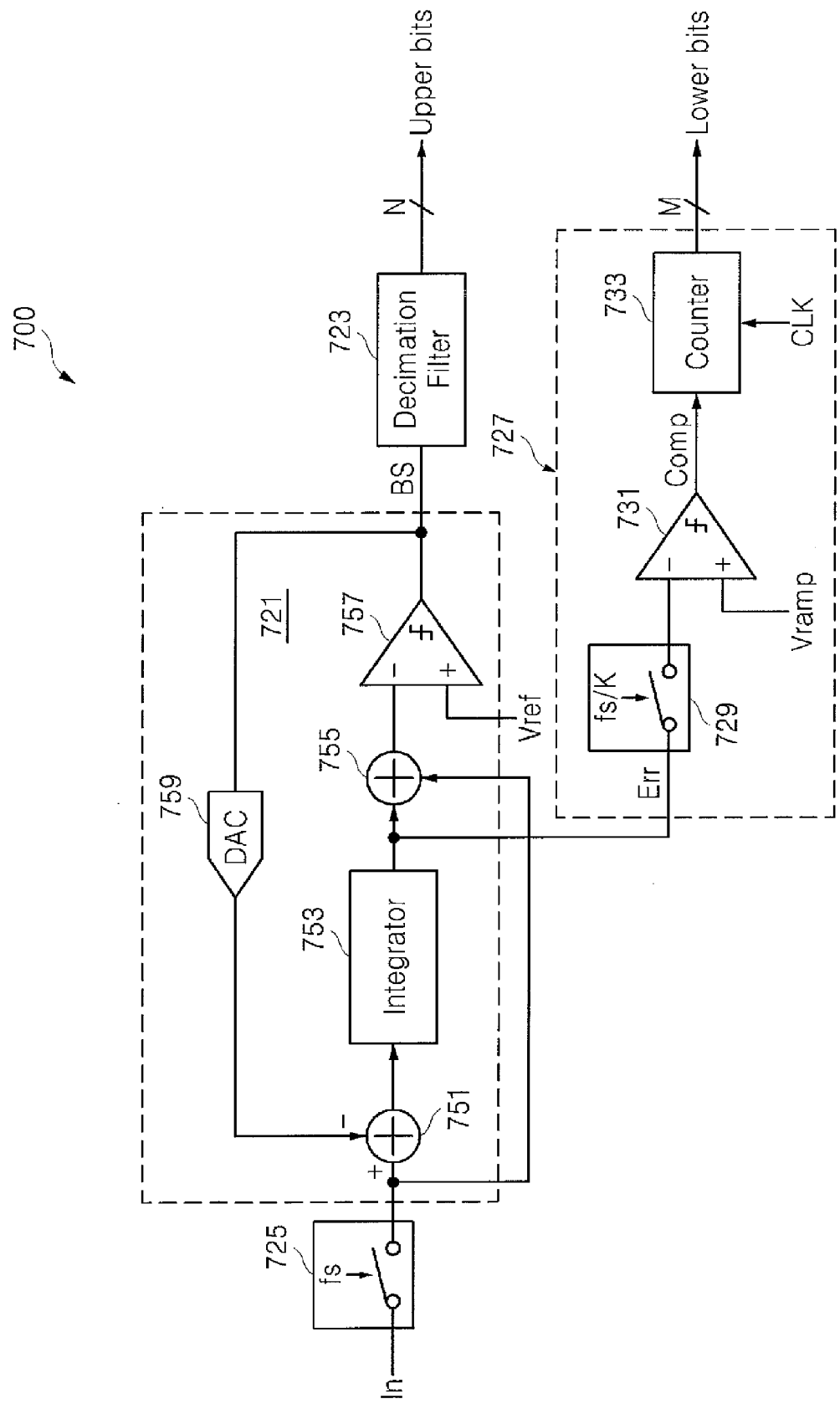
FIG. 7 shows a schematic block diagram of another sigma-delta (ΣΔ) analog to digital converter (ADC) system in accordance with a preferred embodiment of the present disclosure.

As shown in FIG. 7, another sigma-delta (ΣΔ) analog to digital converter (ADC) system is indicated generally by the reference numeral 700. The ΣΔ ADC system 700 includes a first sampling switch 725 for sampling an analog input signal at a sampling rate fs, a ΣΔ modulator 721 in signal communication with the first switch 725 for receiving the fs sampled signal, a decimation filter 723 in signal communication with the modulator 721 for receiving a bit stream (BS) signal and providing N upper bits of digital output, and single-slope ADC 727 in signal communication with the modulator 721 for receiving an error (E) signal and providing M lower bits of digital output.

The modulator 721 includes a first summing junction 751 for receiving the fs sampled signal on a non-inverting input, an integrator 753 in signal communication with the first summing junction for providing an error (E) signal to the single-slope converter 727, a second summing junction 755 for receiving the output of the integrator at a first non-inverting input and the output of the first switch 725 at a second non-inverting input, a comparator 757 having an inverting input for receiving the output of the second summing junction and a non-inverting input for receiving a voltage reference, a digital to analog converter 759 for receiving the digital output of the comparator and providing an analog input to an inverting input of the first summing junction 751. The single-slope ADC 727 includes a second sampling switch 729 that samples at a rate fs/K for receiving and sampling the E signal, a comparator 731 for comparing the sampled E signal with a voltage ramp signal, and a counter 733 for counting pulses from the comparator and outputting the converted lower bits.

Here, the first sampling switch or sampler over-samples with the frequency fs. The inputs of the first summing junction or adder are the over-sampled output of the first sampler and the output of the first integrator. The input of the first comparator is the output of the adder. The first comparator compares the input with Vref to output the bit stream (BS). The quantization error in the output of the first integrator is converted into the lower bits by the single-slope ADC.

Figure 8:
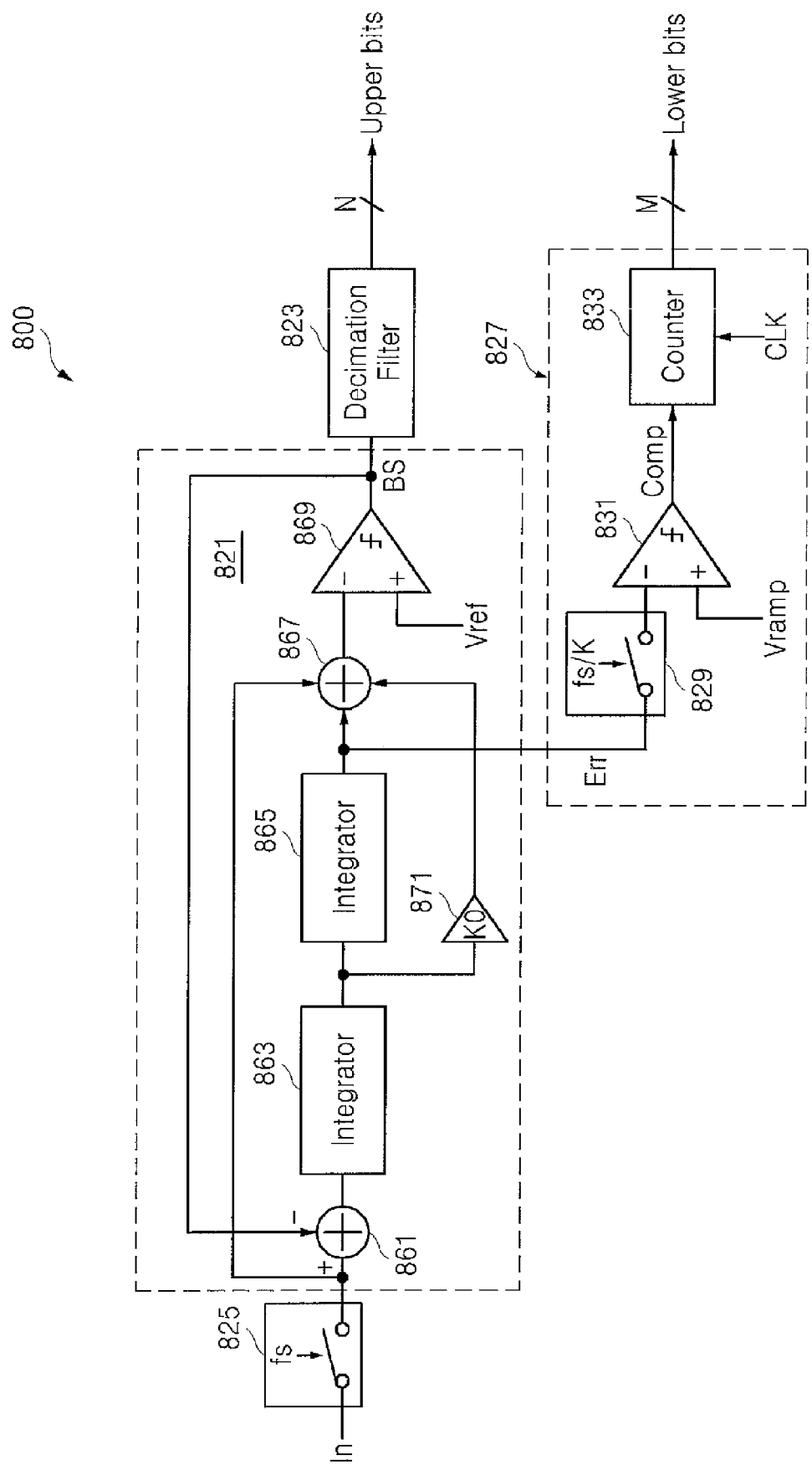
FIG. 8 shows a schematic block diagram of another sigma-delta (ΣΔ) analog to digital converter (ADC) system in accordance with a preferred embodiment of the present disclosure.

Turning to FIG. 8, another sigma-delta (ΣΔ) analog to digital converter (ADC) system is indicated generally by the reference numeral 800. The ΣΔ ADC system 800 includes a first sampling switch 825 for sampling an analog input signal at a sampling rate fs, a ΣΔ modulator 821 in signal communication with the first switch 825 for receiving the fs sampled signal, a decimation filter 823 in signal communication with the modulator 821 for receiving a bit stream (BS) signal and providing N upper bits of digital output, and single-slope ADC 827 in signal communication with the modulator 821 for receiving an error (E) signal and providing M lower bits of digital output.

The modulator 821 includes a first summing junction 861 for receiving the fs sampled signal on a non-inverting input, a first integrator 863 in signal communication with the first summing junction, a second integrator 865 in signal communication with the first integrator for providing an error (E) signal to the single-slope converter 827, a second summing junction 867 for receiving the output of the second integrator at a first non-inverting input, the output of the first switch 825 at a second non-inverting input, and an output from an amplifier receiving its input from the first integrator and having a gain of 2 at a third non-inverting input, a comparator 869 having an inverting input for receiving the output of the second summing junction and a non-inverting input for receiving a voltage reference, where the output of the comparator is fed back to an inverting input of the first summing junction 861. The single-slope ADC 827 includes a second sampling switch 829 that samples at a rate fs/K for receiving and sampling the E signal, a comparator 831 for comparing the sampled E signal with a voltage ramp signal, and a counter 833 for counting pulses from the comparator and outputting the converted lower bits.

Here, the system 800 makes use of two integrators and a scalar coefficient. The inputs of the second summing junction or adder include the output of the first sampler, the scaled output of the first integrator and the output of the second integrator. The input of the first comparator is the output of the second adder. The first comparator compares its input with Vref. The error in the output of the second integrator is converted into the lower bits by the single-slope ADC.

Figure 9:
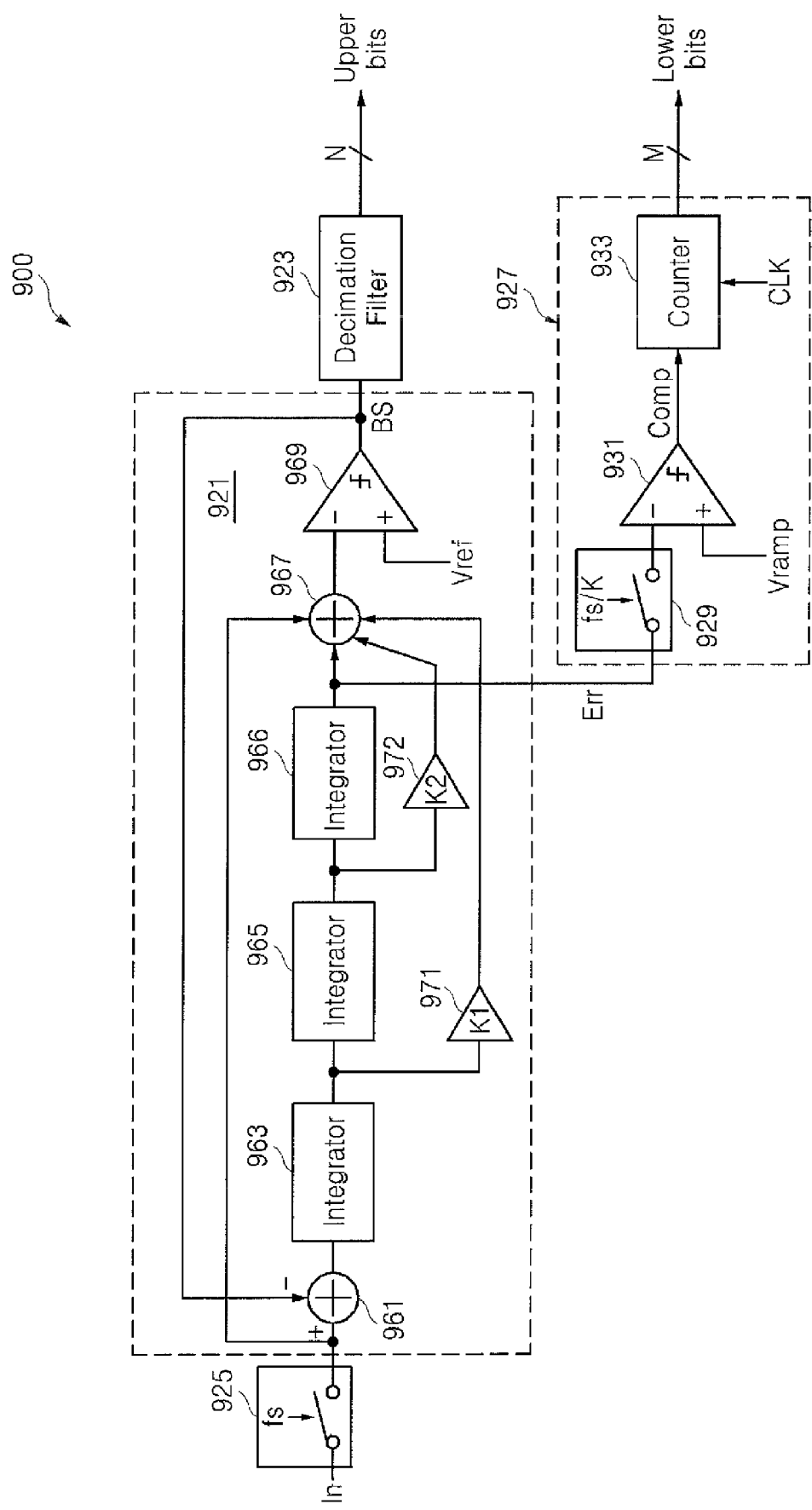
FIG. 9 shows a schematic block diagram of another sigma-delta (ΣΔ) analog to digital converter (ADC) system in accordance with a preferred embodiment of the present disclosure.

Turning now to FIG. 9, another sigma-delta (ΣΔ) analog to digital converter (ADC) system is indicated generally by the reference numeral 900. The ΣΔ ADC system 900 includes a first sampling switch 925 for sampling an analog input signal at a sampling rate fs, a ΣΔ modulator 921 in signal communication with the first switch 925 for receiving the fs sampled signal, a decimation filter 923 in signal communication with the modulator 921 for receiving a bit stream (BS) signal and providing N upper bits of digital output, and single-slope ADC 927 in signal communication with the modulator 921 for receiving an error (E) signal and providing M lower bits of digital output.

The modulator 921 includes a first summing junction 961 for receiving the fs sampled signal on a non-inverting input, a first integrator 963 in signal communication with the first summing junction, a second integrator 965 in signal communication with the first integrator, a third integrator 966 in signal communication with the second integrator for providing an error (E) signal to the single-slope converter 927, a first amplifier 971 having a gain of K1 for receiving the output of the first integrator, a second amplifier 972 having a gain of K2 for receiving the output of the second integrator, a second summing junction 967 for receiving the output of the third integrator at a first non-inverting input, the output of the first switch 925 at a second non-inverting input, the output from the first amplifier at a third non-inverting input, and the output of the second amplifier at a fourth non-inverting input, a comparator 969 having an inverting input for receiving the output of the second summing junction and a non-inverting input for receiving a voltage reference, where the output of the comparator is fed back to an inverting input of the first summing junction 961. The single-slope ADC 927 includes a second sampling switch 929 that samples at a rate fs/K for receiving and sampling the E signal, a comparator 931 for comparing the sampled E signal received on its inverting input with a voltage ramp signal received on its non-inverting input, and a counter 933 for receiving a clock signal and counting pulses from the comparator, and outputting the converted lower bits.

Figure 10:
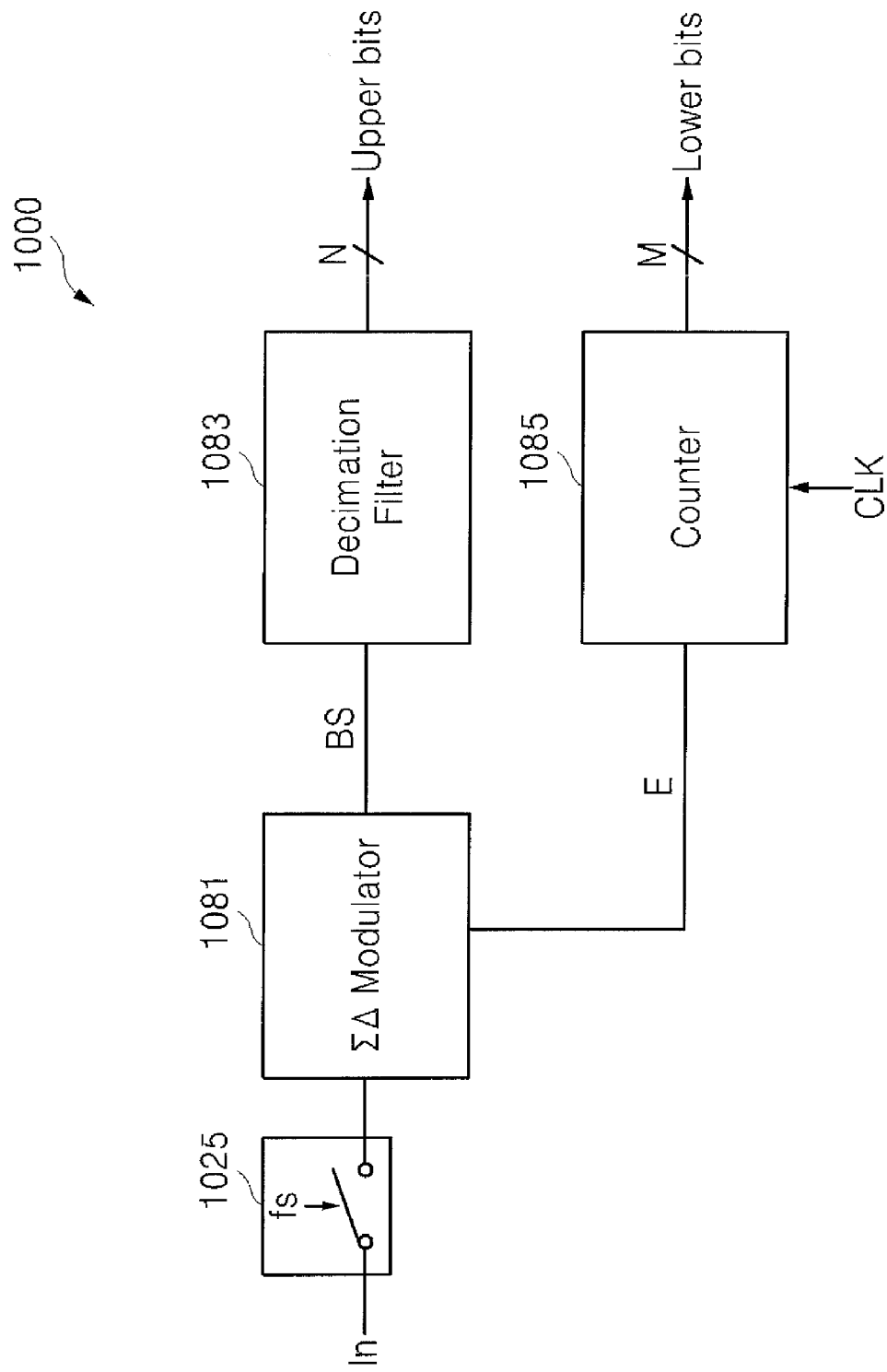
FIG. 10 shows a schematic block diagram of another sigma-delta (ΣΔ) analog to digital converter (ADC) system in accordance with a preferred embodiment of the present disclosure.

As shown in FIG. 10, another sigma-delta (ΣΔ) analog to digital converter (ADC) system is indicated generally by the reference numeral 1000. The ΣΔ ADC system 1000 includes a first sampling switch 1025 for sampling an analog input signal at a sampling rate fs, a ΣΔ modulator 1081 in signal communication with the first switch 1025 for receiving the fs sampled signal, a decimation filter 1083 in signal communication with the modulator 1081 for receiving a bit stream (BS) signal and providing N upper bits of digital output, and a counter 1085 in signal communication with the modulator 1081 for receiving an error (E) signal and providing M lower bits of digital output.

The quantization error of the sigma-delta modulator is converted into the lower bits by a single-slope ADC. Thus, the system 1000 separately outputs upper bits and lower bits, and may then add or combine them without error correction logic. Where there may be a possibility of error between the upper bits and the lower bits caused by an offset effect in the separated comparators 961 and 931 of the system 900 of FIG. 9, for example, the system 1000 can eliminate such an offset effect by using a common shared comparator scheme in the sigma-delta modulator 1081.

Figure 11:
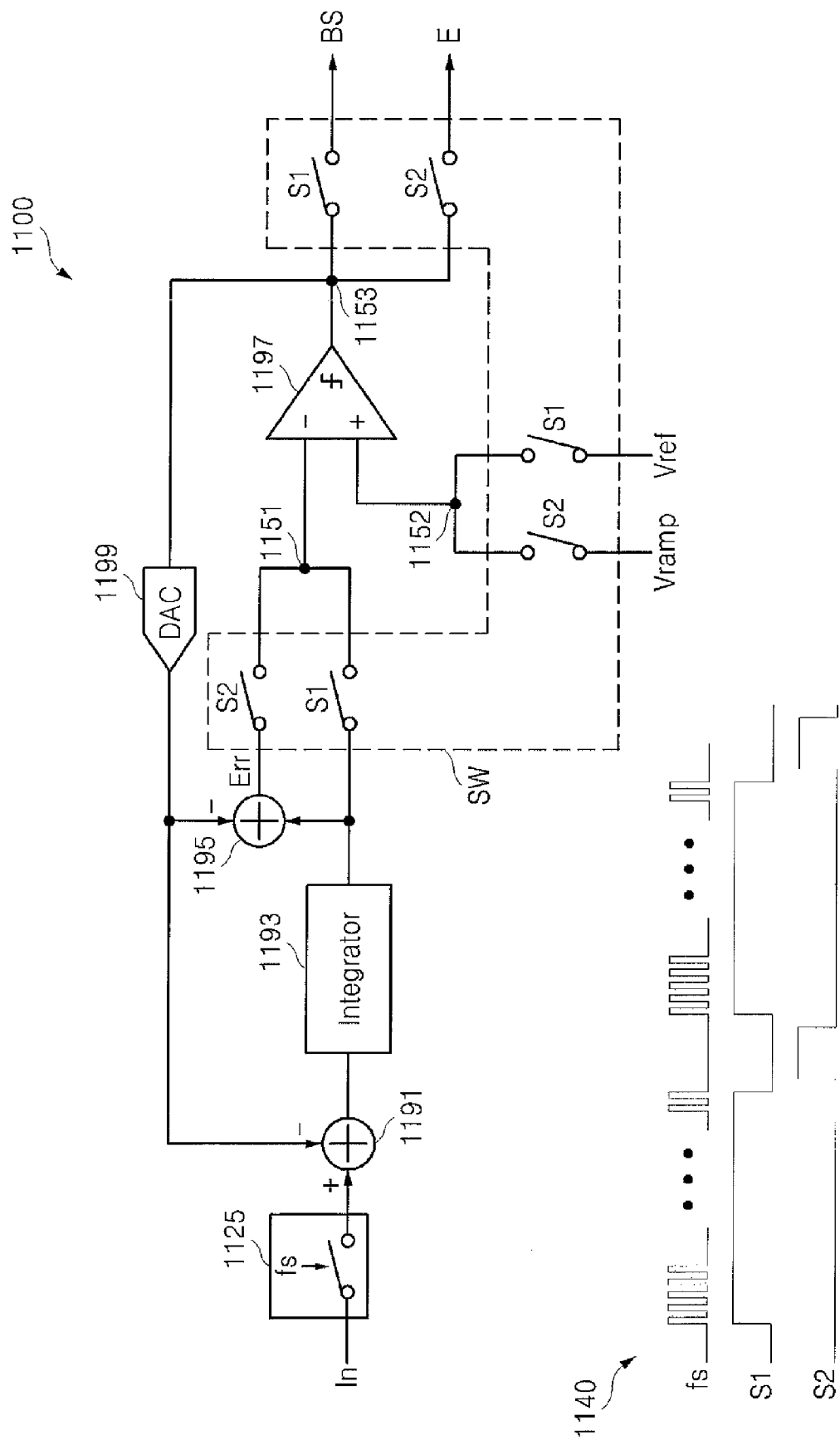
FIG. 11 shows a schematic hybrid diagram of a sigma-delta (ΣΔ) modulator in accordance with a preferred embodiment of the present disclosure.

Turning to FIG. 11, a sigma-delta (ΣΔ) modulator is indicated generally by the reference numeral 1100. The modulator 1100 is similar to the modulator 621 of FIG. 6, but uses a common or shared comparator rather than two separate comparators. The ΣΔ modulator 1100 includes a first summing junction 1191 having a non-inverting input that receives an analog input signal sampled at a frequency fs from a sampling switch 1125, an integrator 1193 connected to the output of the first summing junction, a second summing junction 1195 having a non-inverting input connected to the output of the integrator, a first triple pole single throw (TPST) switch S1 having a first pole connecting the output of the integrator to a node 1151, and a second TPST switch having a first pole connecting the output of the second summing junction to the node 1151 for providing an error (E) signal.

The node 1151 is connected to an inverting input of a shared comparator 1197. The comparator 1197 has a non-inverting input connected to a node 1152. A second pole of the switch S1 connects the node 1152 to a voltage reference signal Vref. A second pole of the switch S2 connects the node 1152 to a voltage ramp signal Vramp. The output of the comparator is connected to a digital to analog converter (DAC) 1199. The output of the DAC is connected to inverting inputs of both the first and second summing junctions 1191 and 1195. The output of the comparator 1197 is further connected to a node 1153. The node 1153 is connected to a third pole of the first TPST switch S1 for outputting a bit stream (BS) signal, and connected to a third pole of the second TPST switch S2 for outputting an error (E) signal.

The first and second TPST switches S1 and S2 are disposed in a switch bank SW, and only one switch is on at a time. Alternatively, a single triple pole double throw (TPDT) or triple pole changeover (TPCO) type of switch may be substituted for the two TPST switches S1 and S2.

A signal graph 1140 shows the switching signals for fs, S1 and S2, respectively In operation, when S1 is closed and S2 is open, BS is output. When S1 is open and S2 is closed, E is output. The common or shared comparator outputs the bit stream (BS) signal when the S1 poles are closed and the S2 poles are open, and outputs the error (E) signal when the S1 poles are open and the S2 poles are closed. That is, the shared comparator 1197 operates like the first comparator 645 of FIG. 6 for the BS output mode when S1 is closed and S2 is open, and operates like the second comparator 631 of FIG. 6 for the E output mode when S1 is open and S2 is closed.

Figure 12:
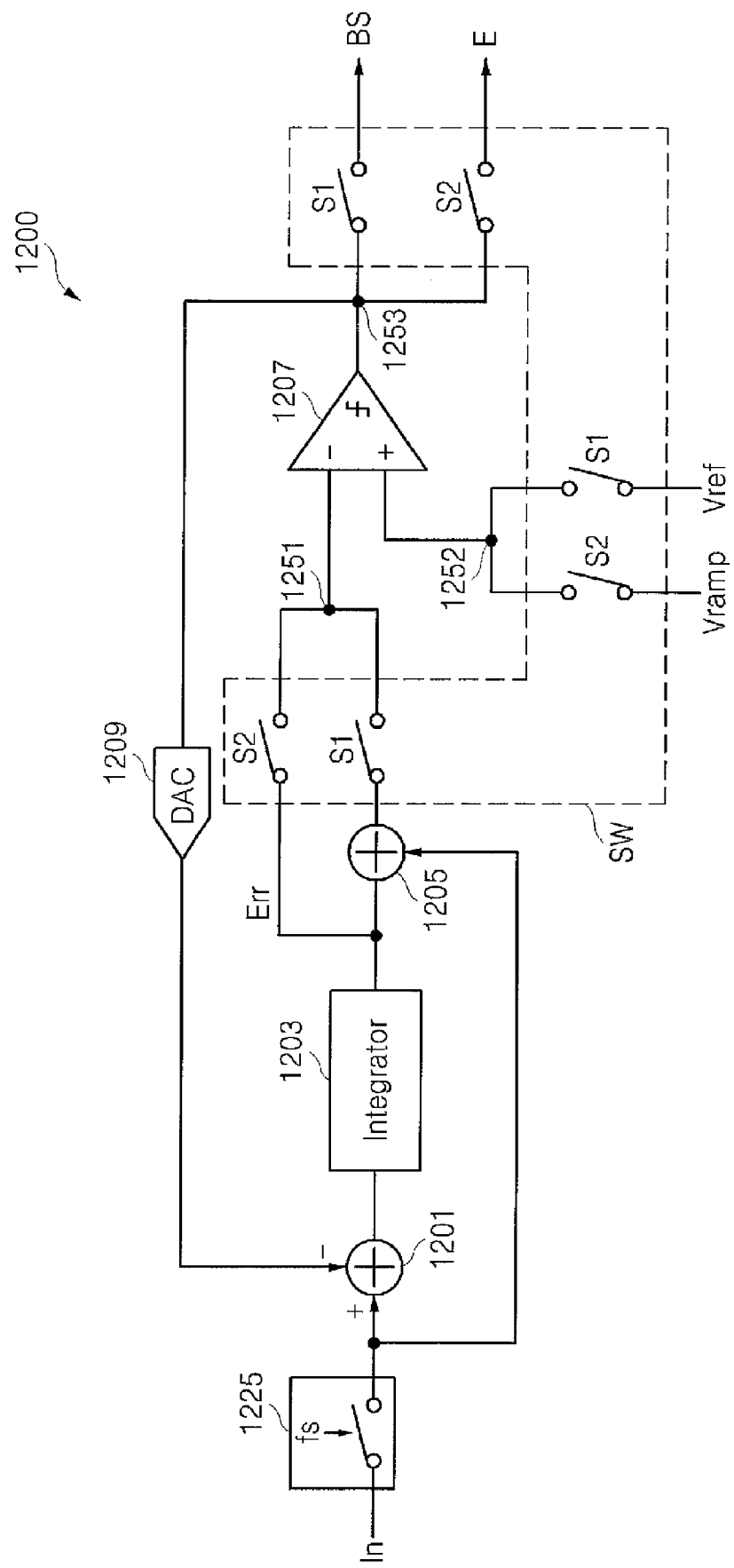
FIG. 12 shows a schematic block diagram of another sigma-delta (ΣΔ) modulator in accordance with a preferred embodiment of the present disclosure.

Turning now to FIG. 12, another sigma-delta (ΣΔ) modulator is indicated generally by the reference numeral 1200. The modulator 1200 is similar to the modulator 721 of FIG. 7, but uses a common or shared comparator rather than two separate comparators. The ΣΔ modulator 1200 includes a first summing junction 1201 having a non-inverting input that receives an analog input signal sampled at a frequency fs from a sampling switch 1225, an integrator 1203 connected to the output of the first summing junction, a second summing junction 1205 having a first non-inverting input connected to the output of the sampling switch 1225 and a second non-inverting input connected to the output of the integrator, a first triple pole single throw (TPST) switch S1 having a first pole connecting the output of the second summing junction to a node 1251, and a second TPST switch having a first pole connecting the output of the integrator to the node 1251 for providing an error (E) signal.

The node 1251 is connected to an inverting input of a shared comparator 1207. The comparator 1207 has a non-inverting input connected to a node 1252. A second pole of the switch S1 connects the node 1252 to a voltage reference signal Vref. A second pole of the switch S2 connects the node 1252 to a voltage ramp signal Vramp. The output of the comparator is connected to a digital to analog converter (DAC) 1209. The output of the DAC is connected to an inverting input of the first summing junction 1201. The output of the comparator 1207 is further connected to a node 1253. The node 1253 is connected to a third pole of the first TPST switch S1 for outputting a bit stream (BS) signal, and connected to a third pole of the second TPST switch S2 for outputting an error (E) signal.

In operation, when S1 is closed and S2 is open, BS is output. When S1 is open and S2 is closed, E is output. Thus, the shared comparator 1207 operates like the first comparator of FIG. 7 in the BS output mode, when S1 is closed and S2 is open, and operates like the second comparator of FIG. 7 in the E output mode, when S1 is open and S2 is closed.

Figure 13:
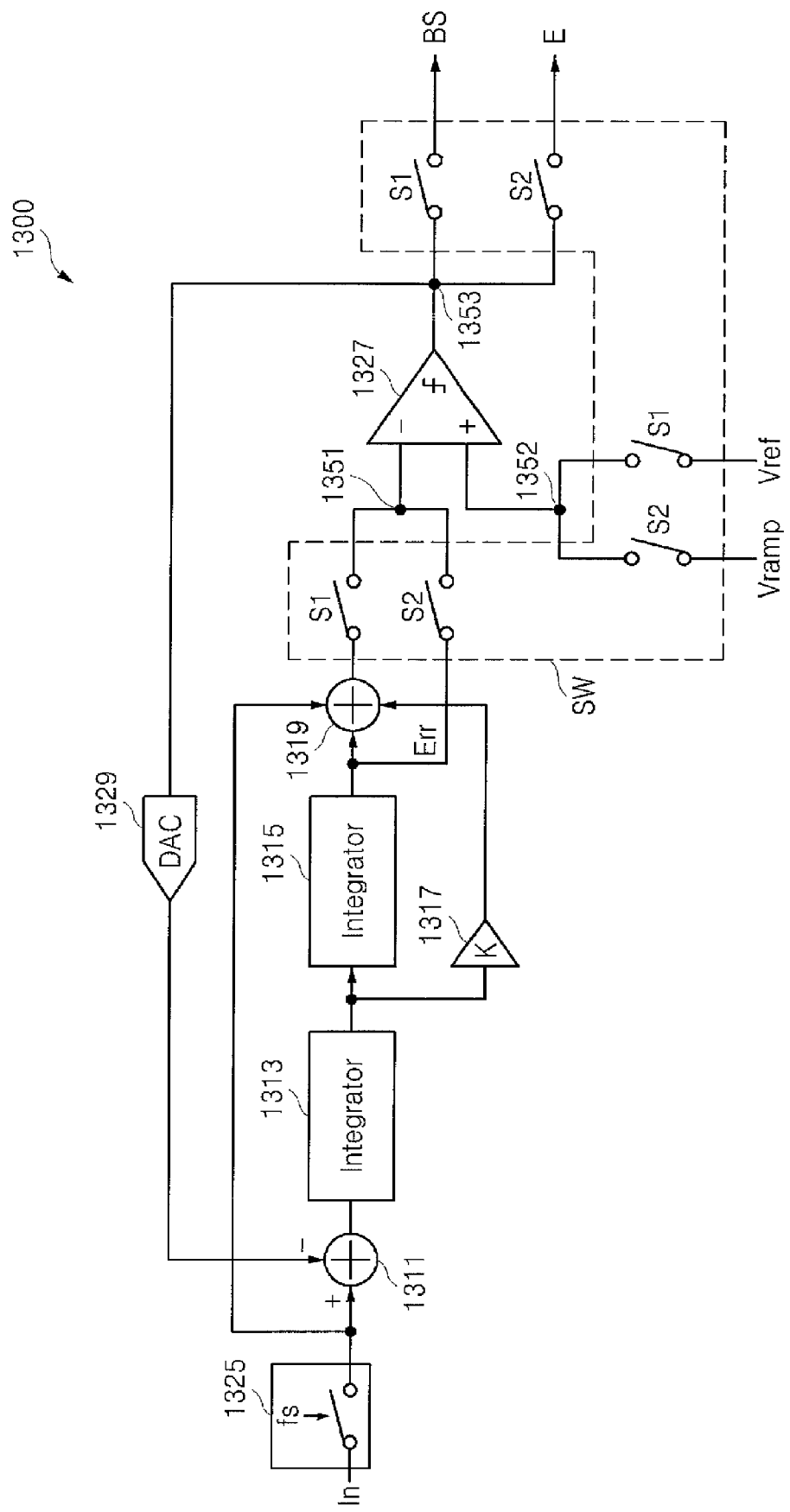
FIG. 13 shows a schematic block diagram of another sigma-delta (ΣΔ) modulator in accordance with a preferred embodiment of the present disclosure.

As shown in FIG. 13, another sigma-delta (ΣΔ) modulator is indicated generally by the reference numeral 1300. The modulator 1300 is similar to the modulator 821 of FIG. 8, but uses a common or shared comparator rather than two separate comparators. The ΣΔ modulator 1300 includes a first summing junction 1311 having a non-inverting input that receives an analog input signal sampled at a frequency fs from a sampling switch 1325, a first integrator 1313 connected to the output of the first summing junction, an amplifier 1317 of gain K connected to the output of the first integrator, a second integrator 1315 connected to the output of the first integrator, a second summing junction 1319 having a first non-inverting input connected to the output of the sampling switch 1325, a second non-inverting input connected to the output of the second integrator 1315 and a third non-inverting input connected to the output of the amplifier 1317, a first triple pole single throw (TPST) switch S1 having a first pole connecting the output of the second summing junction to a node 1351, and a second TPST switch having a first pole connecting the output of the second integrator to the node 1351 for providing an error (E) signal.

The node 1351 is connected to an inverting input of a shared comparator 1327. The comparator 1327 has a non-inverting input connected to a node 1352. A second pole of the switch S1 connects the node 1352 to a voltage reference signal Vref. A second pole of the switch S2 connects the node 1352 to a voltage ramp signal Vramp. The output of the comparator is connected to a digital to analog converter (DAC) 1329. The output of the DAC is connected to an inverting input of the first summing junction 1311. The output of the comparator 1327 is further connected to a node 1353. The node 1353 is connected to a third pole of the first TPST switch S1 for outputting a bit stream (BS) signal, and connected to a third pole of the second TPST switch S2 for outputting an error (E) signal.

In operation, when S1 is closed and S2 is open, BS is output. When S1 is open and S2 is closed, E is output. Thus, the shared comparator 1327 operates like the first comparator of FIG. 8 in the BS output mode, when S1 is closed and S2 is open, and operates like the second comparator of FIG. 8 in the E output mode, when S1 is open and S2 is closed.

Figure 14:
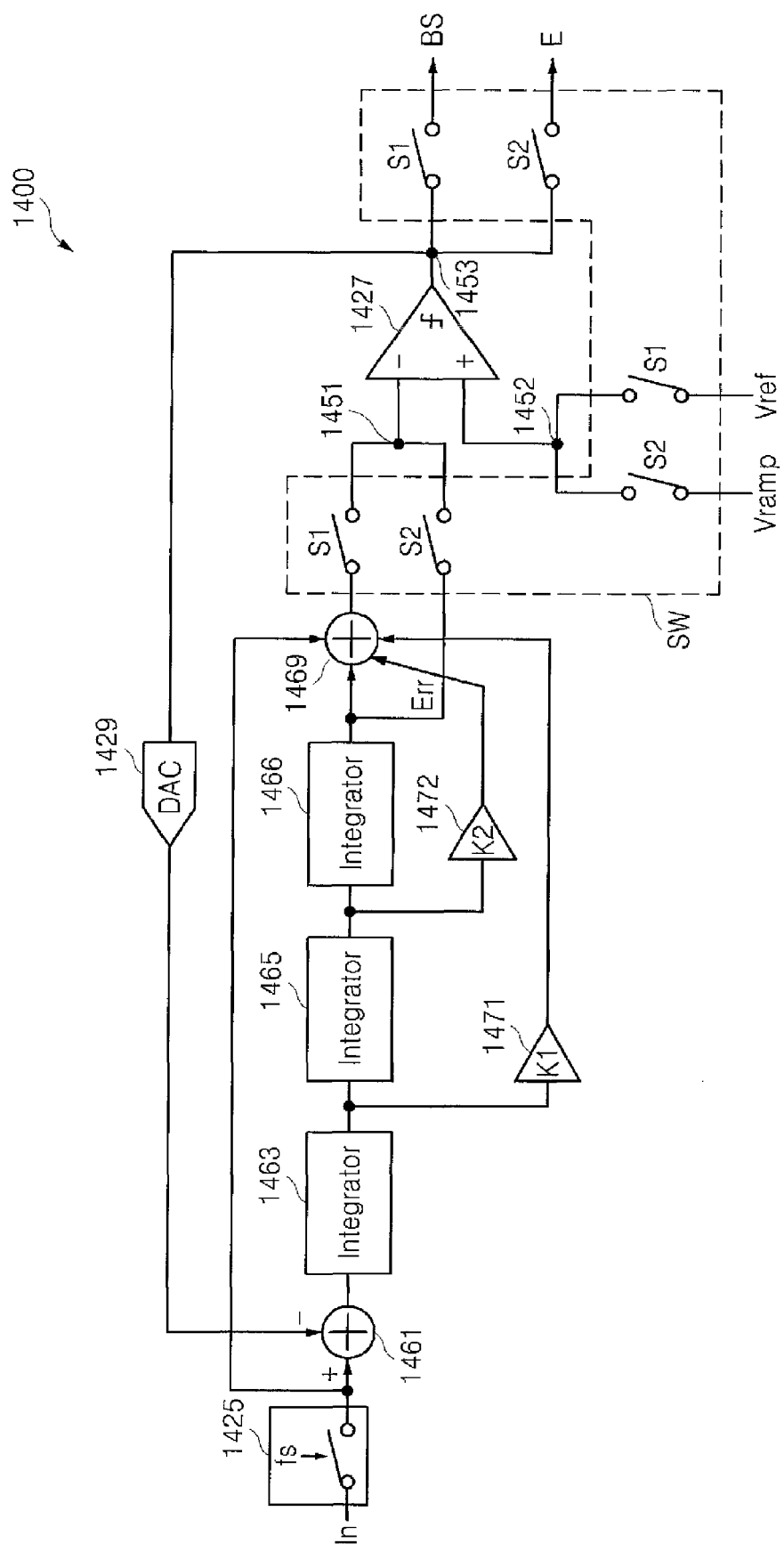
FIG. 14 shows a schematic block diagram of another sigma-delta (ΣΔ) modulator in accordance with a preferred embodiment of the present disclosure.

Turning to FIG. 14, another sigma-delta (ΣΔ) modulator is indicated generally by the reference numeral 1400. The modulator 1400 is similar to the modulator 921 of FIG. 9, but uses a common or shared comparator rather than two separate comparators. The ΣΔ modulator 1400 includes a first summing junction 1461 having a non-inverting input that receives an analog input signal sampled at a frequency fs from a sampling switch 1425, a first integrator 1463 connected to the output of the first summing junction, a first amplifier 1471 of gain K1 connected to the output of the first integrator, a second integrator 1465 connected to the output of the first integrator, a second amplifier 1472 of gain K2 connected to the output of the second integrator, a third integrator 1466 connected to the output of the second integrator, a second summing junction 1469 having a first non-inverting input connected to the output of the sampling switch 1425, a second non-inverting input connected to the output of the third integrator 1466, a third non-inverting input connected to the output of the first amplifier 1471, and a fourth non-inverting input connected to the output of the second amplifier 1472. A first triple pole single throw (TPST) switch S1 has a first pole connecting the output of the second summing junction to a node 1451, and a second TPST switch has a first pole connecting the output of the third integrator to the node 1451 for providing an error (E) signal.

The node 1451 is connected to an inverting input of a shared comparator 1427. The comparator 1427 has a non-inverting input connected to a node 1452. A second pole of the switch S1 connects the node 1452 to a voltage reference signal Vref. A second pole of the switch S2 connects the node 1452 to a voltage ramp signal Vramp. The output of the comparator is connected to a digital to analog converter (DAC) 1429. The output of the DAC is connected to an inverting input of the first summing junction 1461. The output of the comparator 1427 is further connected to a node 1453. The node 1453 is connected to a third pole of the first TPST switch S1 for outputting a bit stream (BS) signal, and connected to a third pole of the second TPST switch S2 for outputting an error (E) signal.

In operation, when S1 is closed and S2 is open, BS is output. When S1 is open and S2 is closed, E is output. Thus, the shared comparator 1427 operates like the first comparator of FIG. 9 in the BS output mode, when S1 is closed and S2 is open, and operates like the second comparator of FIG. 9 in the E output mode, when S1 is open and S2 is closed.

Figure 15:
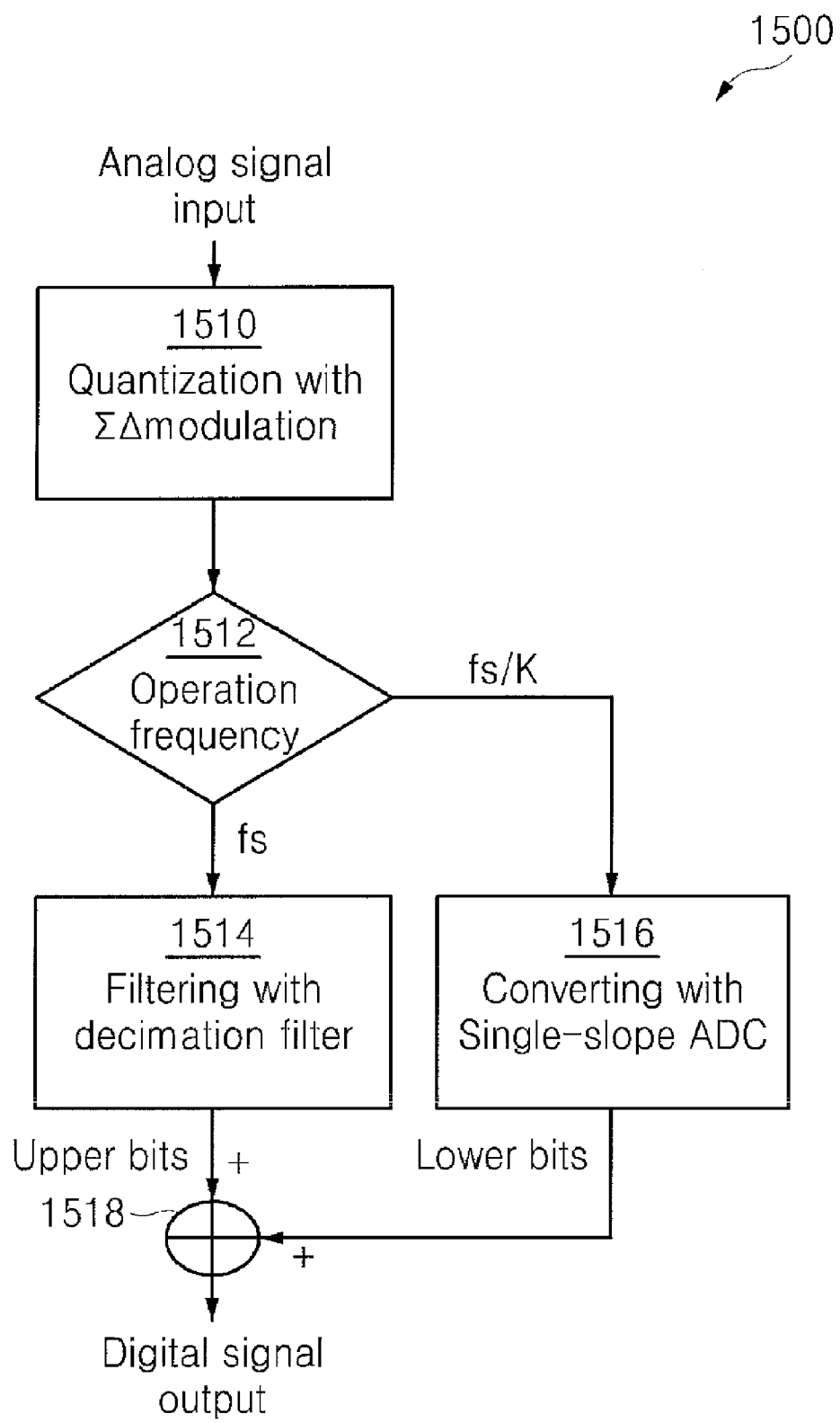
FIG. 15 shows a schematic flow diagram of a method for sigma-delta (ΣΔ) analog to digital conversion in accordance with a preferred embodiment of the present disclosure.

Turning now to FIG. 15, a method for sigma-delta (ΣΔ) analog to digital conversion is indicated generally by the reference numeral 1500. A first function block 1510 receives an analog input signal, performs quantization with ΣΔ modulation, and passes control to a decision block 1512. The decision block 1512 determines whether the operation frequency is fs or fs/K. If the operation frequency is fs, control is passed to a function block 1514. The function block 1514 performs filtering with a decimation filter, and passes control to a summing block 1518. If the operation frequency is fs/K, the decision block 1512 passes control to a function block 1516. The function block 1516 performs conversion with a single-slope analog to digital converter, and passes control to the summing block 1518. The summing block 1518 combines the upper bits from the block 1514 with the lower bits from the block 1516, and provides a digital signal output.

Figure 16:
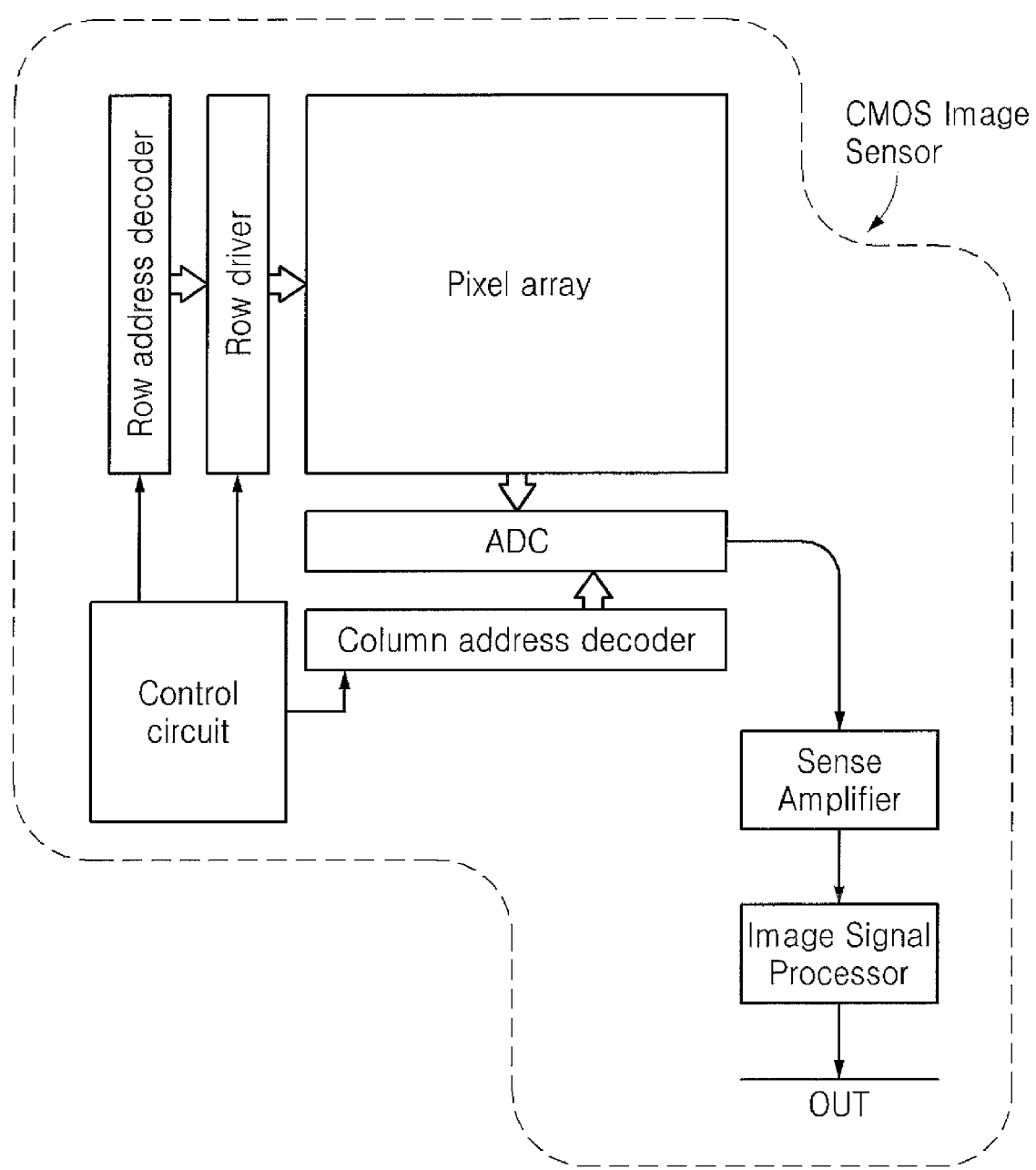
FIG. 16 shows a schematic block diagram of a CMOS image sensor in accordance with a preferred embodiment of the present disclosure.

As shown in FIG. 16, a CMOS image sensor is indicated generally by the reference numeral 1600. The CMOS image sensor 1600 includes a control circuit 1610 connected to a column address decoder 1611, a row address decoder 1612, and a row driver 1614. The row address decoder 1612 is connected to the row driver 1614, which is connected to a pixel array 1618. The pixel array is connected to a column driver 1620. The column address decoder 1611 is connected to the column driver 1620, which, in turn, is connected to a sample and hold unit 1622. The sample and hold unit 1622 is connected to an analog to digital converter (ADC) 1624, which is connected to an image signal processor 1626. The image signal processor 1626, in turn, is connected to a serializer 1628, which provides a digital output.

Here, the CMOS Image Sensor (CIS) has an ADC. Embodiments of the present disclosure can be configured within the ADC. Embodiments of the present invention are not limited to CIS, but may be embodied in other devices that have at least one ADC.

Figure 17:
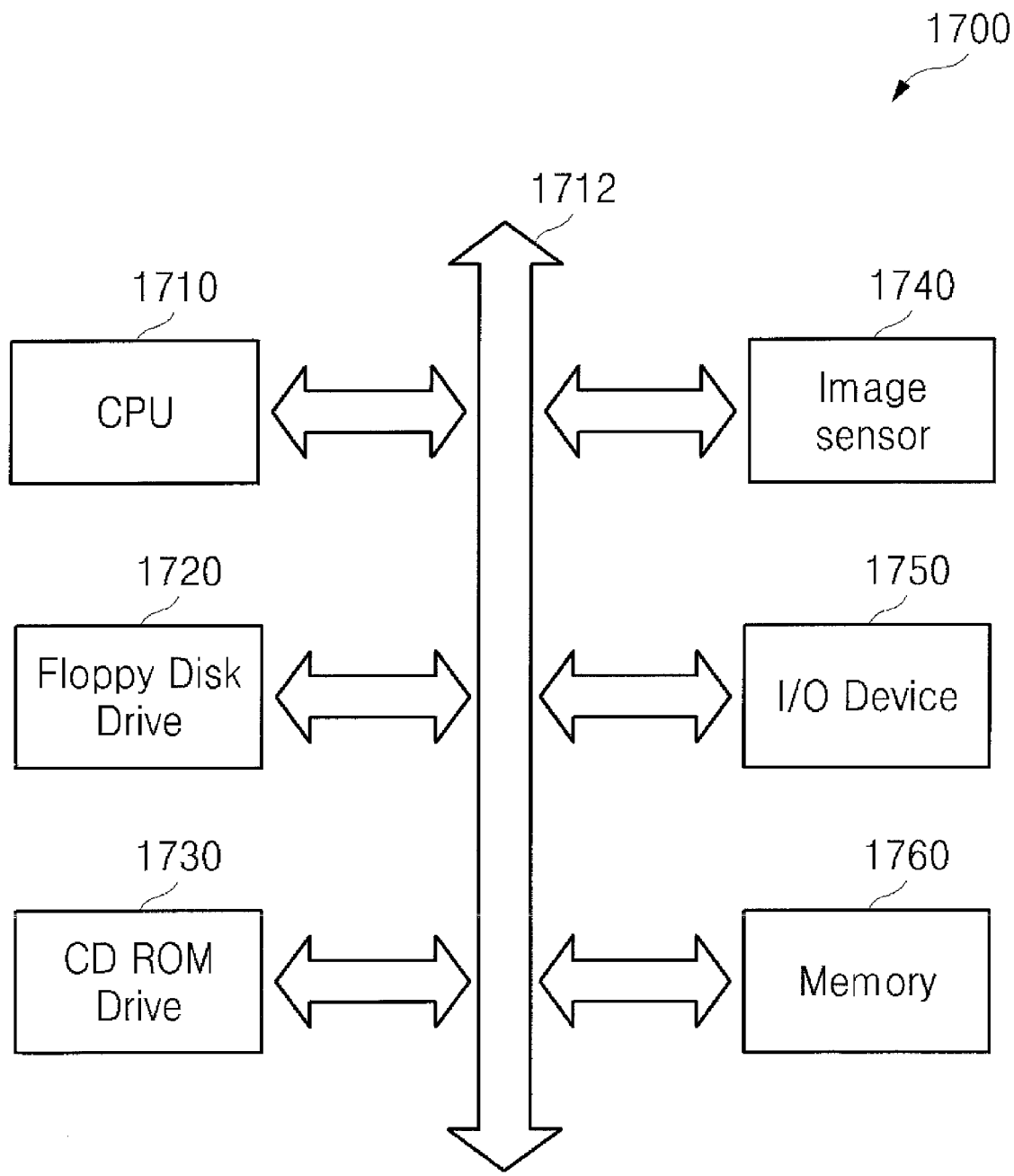
FIG. 17 shows a schematic block diagram of an image processing computer system in accordance with a preferred embodiment of the present disclosure.

Turning to FIG. 17, an image processing computer system having an image sensor is generally indicated by the reference numeral 1700. The system 1700 includes a central processing unit (CPU) 1710 in signal communication with a system bus 1712, a magnetic disk drive 1720 in signal communication with the system bus 1712, an optical disk drive 1730 in signal communication with the system bus 1712, an image sensor 1740 in signal communication with the system bus 1712, an input/output (I/O) device 1750 in signal communication with the system bus 1712, and a memory 1760 in signal communication with the system bus 1712. Here, the magnetic disk drive 1720 may be a floppy disk drive, the optical disk drive 1730 may be a CD ROM drive, and the memory 1760 may be an SDRAM and/or flash memory, for example.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. An analog-to-digital converter (ADC) comprising:
   a first ADC unit having a comparator with a constant reference voltage for providing at least one high-order bit; and
   a second ADC unit connected to the first ADC unit, the second ADC unit having the comparator with a variable reference voltage for providing at least one low-order bit,
   wherein the first ADC unit and the second ADC unit share the comparator.

2. The ADC as defined in claim 1, further comprising an adder in signal communication with the first and second ADC units for adding the at least one high-order bit and the at least one low-order bit.

3. The ADC as defined in claim 1, wherein the variable reference voltage has a single slope.

4. The ADC as defined in claim 3, wherein the slope of the variable reference voltage is controllable.

5. The ADC as defined in claim 1, wherein the first ADC unit and the second ADC unit switchably share the comparator.

6. An analog-to-digital converter (ADC) comprising:
   a comparator;
   a first ADC portion supplying the comparator with a constant reference voltage for providing at least one high-order bit; and
   a second ADC portion supplying the comparator with a variable reference voltage for providing at least one low-order bit,
   wherein the first ADC portion and the second ADC portion share the comparator.

7. The ADC as defined in claim 6, further comprising an adder in signal communication with the first and second ADC portions for adding the at least one high-order bit and the at least one low-order bit.

8. The ADC as defined in claim 6, wherein the variable reference voltage has a single slope.

9. The ADC as defined in claim 8, wherein the slope of the variable reference voltage is controllable.

10. The ADC as defined in claim 6, wherein the first ADC portion and the second ADC portion switchably share the comparator.

11. A CMOS image sensor comprising:
    a pixel driver; and
    an analog-to-digital converter (ADC) connected to the driver, the ADC having a comparator, a first ADC portion supplying the comparator with a constant reference voltage for providing at least one high-order bit, and a second ADC portion supplying the comparator with a variable reference voltage for providing at least one low-order bit,
    wherein the first ADC portion and the second ADC portion share the comparator.

12. The image sensor as defined in claim 11, further comprising an adder in signal communication with the first and second ADC portions for adding the at least one high-order bit and the at least one low-order bit.

13. The image sensor as defined in claim 11, wherein the variable reference voltage has a single slope.

14. The image sensor as defined in claim 13, wherein the slope of the variable reference voltage is controllable.

15. The ADC as defined in claim 11, wherein the first ADC portion and the second ADC portion switchably share the comparator.

16. An analog-to-digital converter (ADC) device comprising:
    a sigma-delta ADC for sampling an analog input signal at a first sampling rate and providing at least one upper bit of a digital output signal and an error signal; and
    a single-slope ADC connected to the sigma-delta ADC for receiving the error signal and providing at least one lower bit of the digital output signal,
    wherein the sigma-delta ADC and the single-slope ADC switchably share a comparator.

17. The ADC device as defined in claim 16, the sigma-delta ADC comprising:
    a sampler for receiving the analog input signal and providing an over-sampled signal at the first sampling rate;
    a sigma-delta modulator connected to the sampler for receiving the over-sampled signal and providing a bit-stream signal and an error signal; and
    a decimation filter connected to the sigma-delta modulator for receiving the bit-stream signal and providing at least one upper bit of the digital output signal.

18. The ADC device as defined in claim 17, the sigma-delta modulator comprising a comparator connected to the input of the decimation filter, the comparator having an inverting input and a non-inverting input, the non-inverting input disposed for receiving a voltage reference signal.

19. The ADC device as defined in claim 18, the sigma-delta modulator further comprising at least one integrator connected to the inverting input of the comparator.

20. The ADC device as defined in claim 18, the sigma-delta modulator further comprising at least one digital-to-analog converter (DAC) connected to the output of the comparator.

21. The ADC device as defined in claim 16, the single-slope ADC comprising a counter.

22. The ADC device as defined in claim 21, the single-slope ADC further comprising a comparator connected to the input of the counter, the comparator having an inverting input and a non-inverting input, the non-inverting input disposed for receiving a voltage ramp or staircase-shaped signal.

23. The ADC device as defined in claim 22, the single-slope ADC further comprising a sampler connected between the sigma-delta ADC and the inverting input of the comparator, the sampler disposed for receiving the error signal and providing a sampled error signal at a second sampling rate.

24. The ADC device as defined in claim 16, wherein the sigma-delta ADC and the single-slope ADC share a sampler.

25. An analog-to-digital converting method comprising:
    sampling an analog input signal at a first sampling rate and providing at least one upper bit of a digital output signal and an error signal; and
    providing at least one lower bit of the digital output signal responsive to the error signal,
    wherein the method further comprises switching between providing the at least one upper bit of the digital output signal and providing the at least one lower bit of the digital output signal by switching the inputs and output of a single comparator.

26. The method as defined in claim 25, further comprising:
    receiving the analog input signal and providing an over-sampled signal at the first sampling rate;
    providing a bit-stream signal and an error signal responsive to the over-sampled signal; and
    providing the at least one upper bit of the digital output signal responsive to the bit-stream signal.

27. The method as defined in claim 26, further comprising decimating the bit-stream signal to provide the at least one upper bit of the digital output signal.

28. The method as defined in claim 26, further comprising:
    integrating the over-sampled signal;
    receiving a voltage reference signal; and comparing the voltage reference signal with the integrated signal to provide the bit-stream signal.

29. The method as defined in claim 28, further comprising: converting the bit-stream signal into an analog signal; and subtracting the converted signal from the over-sampled signal prior to integration.

30. The method as defined in claim 25, further comprising counting a signal responsive to the error signal to provide the at least one lower bit of the digital output signal.

31. The method as defined in claim 30, further comprising: receiving a voltage ramp or staircase-shaped signal; and comparing the error signal with the voltage ramp or staircase-shaped signal to provide the signal responsive to the error signal for counting.

32. The method as defined in claim 31, further comprising sampling the error signal and providing a sampled error signal at a second sampling rate before comparing.

33. The method as defined in claim 25, further comprising:
switching the inverting input of the single comparator between an integrated over-sampled signal and an error signal, respectively;
switching the non-inverting input of the single comparator between a voltage reference signal and a voltage staircase signal, respectively; and
switching the output of the single comparator between a bit-stream signal and a compared signal, respectively.

34. The method as defined in claim 33, further comprising:
decimating the switched bit-stream signal to provide the at least one upper bit of the digital output signal; and
counting the compared signal to provide the at least one lower bit of the digital output signal.

35. A multi-media system comprising:
at least one input/output device; and
a multi-media processor connected to the at least one input/output device, the multi-media processor having a sigma-delta analog-to-digital converter (ADC) for sampling an analog input signal at a first sampling rate and providing at least one upper bit of a digital output signal and an error signal, and a single-slope ADC connected to the sigma-delta ADC for receiving the error signal and providing at least one lower bit of the digital output signal,
wherein the sigma-delta ADC and the single-slope ADC switchably share a comparator.

36. A CMOS image sensor comprising:
a pixel array;
a driver connected to the pixel array; and
an analog-to-digital converter (ADC) unit connected to the driver, the ADC unit having a sigma-delta ADC for sampling an analog input signal at a first sampling rate and providing at least one upper bit of a digital output signal and an error signal, and a single-slope ADC connected to the sigma-delta ADC for receiving the error signal and providing at least one lower bit of the digital output signal,
wherein the sigma-delta ADC and the single-slope ADC switchably share a comparator.

37. A sigma-delta analog to digital converter (ADC) system comprising:
a first sampling switch that samples an analog input signal at a sampling rate,
a sigma-delta modulator in signal communication with the first switch that receives the sampled signal,
a decimation filter in signal communication with the sigma-delta modulator that receives a bit stream signal from the sigma-delta modulator and that provides upper bits of digital output, and
a single-slope ADC in signal communication with the sigma-delta modulator that receives an error signal and that provides lower bits of digital output,
wherein the sigma-delta modulator comprises:
a first summing junction that receives the sampled signal on a non-inverting input,
a first integrator in signal communication with the first summing junction,
a second integrator in signal communication with the first integrator that provides an error signal to the single-slope converter,
a second summing junction that receives the output of the second integrator at a first non-inverting input and the output of the first switch at a second non-inverting input,
a comparator having an inverting input that receives the output of the second summing junction and a non-inverting input that receives a voltage reference, wherein the output of the comparator is fed back to an inverting input of the first summing junction, and
wherein the single-slope ADC comprises:
a second sampling switch that receives and samples the error signal,
a second comparator that compares the sampled error signal with a voltage ramp signal, and
a counter that counts pulses from the comparator and that outputs the converted lower bits.

38. The sigma-delta ADC system as defined in claim 37, further comprising a scaling amplifier, wherein inputs of the second summing junction further includes the output of the first integrator scaled by the scaling amplifier.

* * * * *